United States Patent
Sato

(10) Patent No.: US 8,837,233 B2
(45) Date of Patent: Sep. 16, 2014

(54) SEMICONDUCTOR DEVICE

(75) Inventor: Tomohiko Sato, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 13/586,597

(22) Filed: Aug. 15, 2012

(65) Prior Publication Data

US 2012/0307573 A1    Dec. 6, 2012

Related U.S. Application Data

(62) Division of application No. 12/797,206, filed on Jun. 9, 2010, now abandoned.

(30) Foreign Application Priority Data

Jun. 10, 2009 (JP) ................................. 2009-139320

(51) Int. Cl.
   *G11C 5/14*  (2006.01)
   *G11C 7/12*  (2006.01)

(52) U.S. Cl.
   CPC . *G11C 7/12* (2013.01); *G11C 5/146* (2013.01)
   USPC .................................................... 365/189.09

(58) Field of Classification Search
   USPC .................................................... 365/189.09
   See application file for complete search history.

(56) References Cited

U.S. PATENT DOCUMENTS

| | | | |
|---|---|---|---|
| 5,557,231 A | 9/1996 | Yamaguchi et al. | |
| 5,689,461 A | 11/1997 | Kaneko et al. | |
| 5,982,688 A | 11/1999 | Han | |
| 6,002,162 A * | 12/1999 | Takahashi et al. | 257/544 |
| 6,518,825 B2 | 2/2003 | Miyazaki et al. | |
| 7,355,913 B2 * | 4/2008 | Kang et al. | 365/207 |
| 2001/0015930 A1 | 8/2001 | Ooishi | |
| 2007/0140027 A1 * | 6/2007 | Song et al. | 365/203 |
| 2007/0153611 A1 | 7/2007 | Lee | |
| 2009/0154248 A1 | 6/2009 | Noda | |

FOREIGN PATENT DOCUMENTS

| | | |
|---|---|---|
| JP | 06-089574 A | 3/1994 |
| JP | 07-130175 A | 5/1995 |

* cited by examiner

*Primary Examiner* — Anthan Tran
(74) *Attorney, Agent, or Firm* — Sughrue Mion, PLLC

(57) ABSTRACT

A semiconductor device includes first and second bit lines, and a transistor coupled between the first and second bit lines. The semiconductor device further includes a substrate bias control circuit that supplies one of a first substrate bias voltage and a second substrate bias voltage to the transistor. By controlling the substrate bias voltage of the transistor, high-speed equalization is performed, and an increase in leak current at times of standby and activation is prevented.

19 Claims, 8 Drawing Sheets

SEMICONDUCTOR DEVICE

CROSS-REFERENCE TO RELATED APPLICATION

This application is a divisional of U.S. patent application Ser. No. 12/797,206, filed Jun. 9, 2010, which claims priority to Japanese Patent Application No. 2009-139320, filed Jun. 10, 2009, the contents of all of which are incorporated herein by reference.

The present invention relates to a semiconductor device. More specifically, the invention relates to a semiconductor device including a bit line equalize transistor.

BACKGROUND

An equalize circuit is used for bit lines of a semiconductor memory device. Especially when the potential of a bit line targeted for data reading and the potential of a bit line that serves as a comparison reference for the bit line targeted for data reading are amplified by a differential-type sense amplifier and read or refreshed in a DRAM (dynamic random access memory) or the like, it is necessary to equalize the bit lines so that a potential difference between the bit lines is eliminated before data is read onto the bit line from a memory cell.

FIG. 1 of Patent Document 1 and description of FIG. 1 describe high-speed equalization using a signal φEQL as a gate control signal for an equalize transistor 13. The signal φEQL has been level converted to a voltage higher than an externally applied supply voltage by a level conversion circuit 16.

Patent Document 2 describes that power consumption in a standby state can be reduced, and an operation speed in an active state can be improved by switching a substrate bias of an NMOS transistor between the active state and the standby state and varying the threshold value of the NMOS transistor in a semiconductor device such as a DRAM or an SRAM, including NMOS transistors.

[Patent Documents 1] JP Patent Kokai Publication No. JP-A-7-130175, which corresponds to U.S. Pat. No. 5,689,461.
[Patent Documents 2] JP Patent Kokai Publication No. JP-A-6-89574, which corresponds to U.S. Pat. No. 5,557,231.

SUMMARY

The above Patent Documents are incorporated herein by reference thereto.

The following analyses are given by the present invention. When a chip size is to be reduced by reducing the number of sense amplifier columns in a semiconductor memory device, the number of memory cells connected to a bit line increases. As a result, a time constant of the bit line increases, and a precharging time therefore increases.

When the signal of which a voltage level has been converted to the voltage level (boosted voltage level) higher than the externally applied supply voltage is employed as the control signal for the equalize circuit as described in the above-mentioned Patent Document 1, driving capability of the equalize transistor can be increased, and a precharging time can be reduced. In that case, however, a high voltage is applied to a gate voltage of the equalize transistor. Thus, a film thickness of the gate insulating film of the equalize transistor must be increased, and a gate withstand voltage must be thereby increased. Further, a high-voltage signal is used as the control signal for the equalize circuit. Thus, there is also a problem that power consumption of the equalize circuit increases.

Patent Document 2 describes control of the substrate bias of the NMOS transistor according to whether the semiconductor device is in the active state or the standby state. Patent Document 2, however, does not cover an equalize transistor.

A semiconductor device according to one aspect of the present invention comprises:

first and second bit lines;

a transistor coupled between the first and second bit lines; and a substrate bias control circuit that supplies one of a first substrate bias voltage and a second substrate bias voltage to the transistor as a substrate bias voltage.

A semiconductor device according to another aspect of the present invention comprises:

a sense amplifier that amplifies a potential difference between a first sense line and a second sense line;

an equalize transistor with one of first and second electrodes thereof connected to the first sense line and the other of the first and second electrodes thereof connected to the second sense line, an equalize signal that controls an equalization operation of the first and second sense lines being supplied to a control terminal the equalize transistor; and a substrate bias control circuit that supplies one of a first substrate bias voltage and a second substrate bias voltage to the equalize transistor as a substrate bias voltage;

the substrate bias control circuit supplying the second substrate bias voltage to the equalize transistor before activation of the equalize signal and supplying the first substrate bias voltage to the equalize transistor after potentials of the first and second sense lines have become generally equal.

The meritorious effects of the present invention are summarized as follows.

According to the semiconductor device of the present invention, a first substrate bias potential or a second substrate bias potential is supplied to the transistor that connects the bit lines. Thus, even if a high withstand voltage transistor is not used for the transistor, high-speed equalization of the bit lines can be performed, and leak current between the bit lines can be prevented. Operation after the equalization is not thereby adversely affected.

According to the semiconductor device of the present invention, even if the high withstand voltage transistor is not used, high-speed equalization of sense lines can be performed, and leak current between the sense lines after the equalization is prevented. Amplification operation after the equalization is not thereby adversely affected.

PREFERRED MODES

Figure 1:
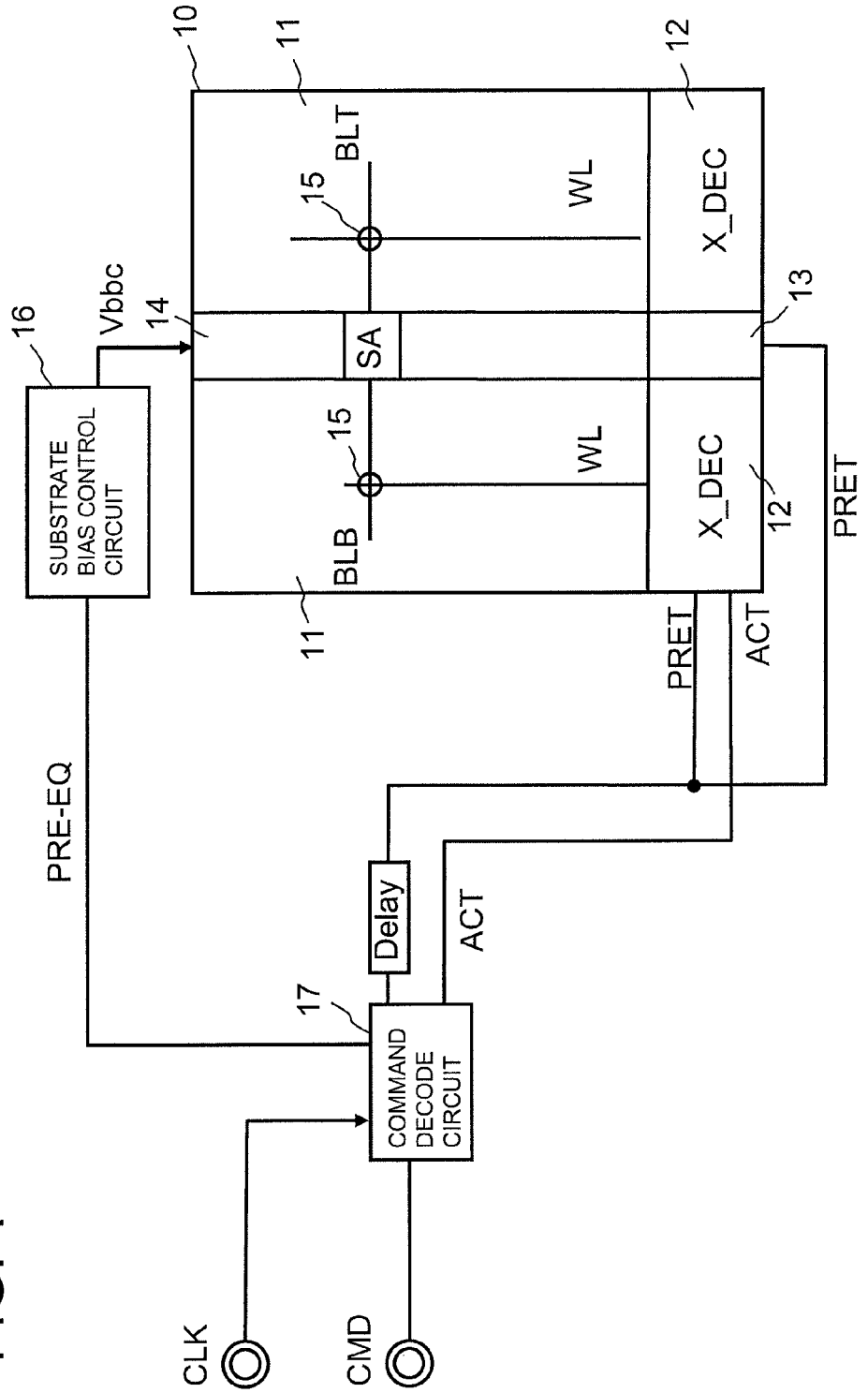
FIG. 1 is a block diagram of a semiconductor memory device in an example of the present invention.

An overview of the present invention will be described with reference to drawings, as necessary. The drawings and reference characters of the drawings cited in the description of the overview are shown as an example of an exemplary embodiment, and do not thereby limit a variation of the exemplary embodiment of the present invention.

According to the exemplary embodiment of the present invention, a shallow second substrate bias voltage VB2 can be supplied to a transistor 21 provided between bit lines to reduce the absolute value of the threshold value of the transistor 21. Thus, high-speed equalization can be performed. After the equalization has been completed, a deeper first substrate bias voltage VB1 can be supplied to the transistor 21 to increase the absolute value of the threshold value. Thus, leak current between the bit lines is prevented, and operation after the equalization is not thereby adversely affected. Further, by dynamically performing threshold value control by the substrate bias voltage, an on-resistance of the transistor 21 can be reduced even if a high voltage is not applied to the gate of the transistor 21. Thus, it is not necessary to use a high withstand voltage transistor for the transistor 21. With this configuration, a precharging time can be reduced without using a signal of a boosted voltage level as a control signal for the equalize circuit. An increase in the leak current at times of standby and activation can also be suppressed.

In addition to a semiconductor memory device, the present invention can also be applied to a semiconductor device that uses a sense amplifier that amplifies a potential difference between first and second sense lines. An equalize transistor is used between the sense lines in the sense amplifier. High-speed equalization can be performed without using a high withstand voltage transistor as the equalize transistor and leak current between the sense lines after the equalization can be prevented. A detailed description will be given about examples, with reference to drawings.

First Example

FIG. 1 is a block diagram of a semiconductor memory device 1 in a first example. The semiconductor memory device 1 in the first example includes a command decode circuit 17 that decodes a command supplied from a command signal input terminal CMD in synchronization with a clock signal supplied from a clock signal input terminal CLK, thereby controlling overall operation of the semiconductor memory device 1, a bank region 10 including a memory cell array 11 and a peripheral circuit of the memory cell array 11, and a substrate bias control circuit 16 that controls a substrate bias which is supplied to a transistor provided for bit line equalization. In addition to the memory cell array 11, the bank region 10 includes row decoders 12 each of which specifies a row address of the memory cell array 11, sense amplifier columns 14 in which a plurality of sense amplifiers SA are disposed, and an equalize control circuit 13 that controls equalization between bit lines.

The command decode circuit 17 receives the command supplied from the command signal input terminal in synchronization with the clock signal supplied from the clock signal input terminal CLK, and generates an internal command signal corresponding to the input command.

The memory cell array 11 includes a plurality of word lines (WL) and a plurality of bit lines (BLT, BLB, and the like) and includes memory cells 15 provided corresponding to intersections between the respective bit lines and the respective word lines. The sense amplifiers SA and the like each connected between a pair of the bit lines are disposed between the memory cell arrays 11, as the sense amplifier columns 14.

An equalizing precharge signal PRE-EQ is connected to the substrate bias control circuit 16 from the command decode circuit 17. A precharge signal PRET from the command decode circuit 17 is connected to the row decoder 12 and the equalize control circuit 13 through a delay circuit Delay.

The command decode circuit 17 supplies an act signal ACT corresponding to an active command (ACT command) and a precharge command (PRE command) supplied from an outside to the row decoder 12. The command decode circuit 17 supplies the precharge signal PRET corresponding to the active command and the precharge command supplied from the outside to the row decoder 12 and the equalize control circuit 13 through the delay circuit Delay. Further, the command decode circuit 17 supplies the equalizing precharge signal PRE-EQ corresponding to the active and precharge commands supplied from the outside to the substrate bias control circuit 16.

The substrate bias control circuit 16 is a circuit that controls a substrate bias voltage Vbbc that is supplied to the transistor provided for bit line equalization, and supplies the substrate bias voltage Vbbc to the transistor for bit line equalization, in response to the equalizing precharge signal PRE-EQ supplied from the command decode circuit 17.

Figure 2:
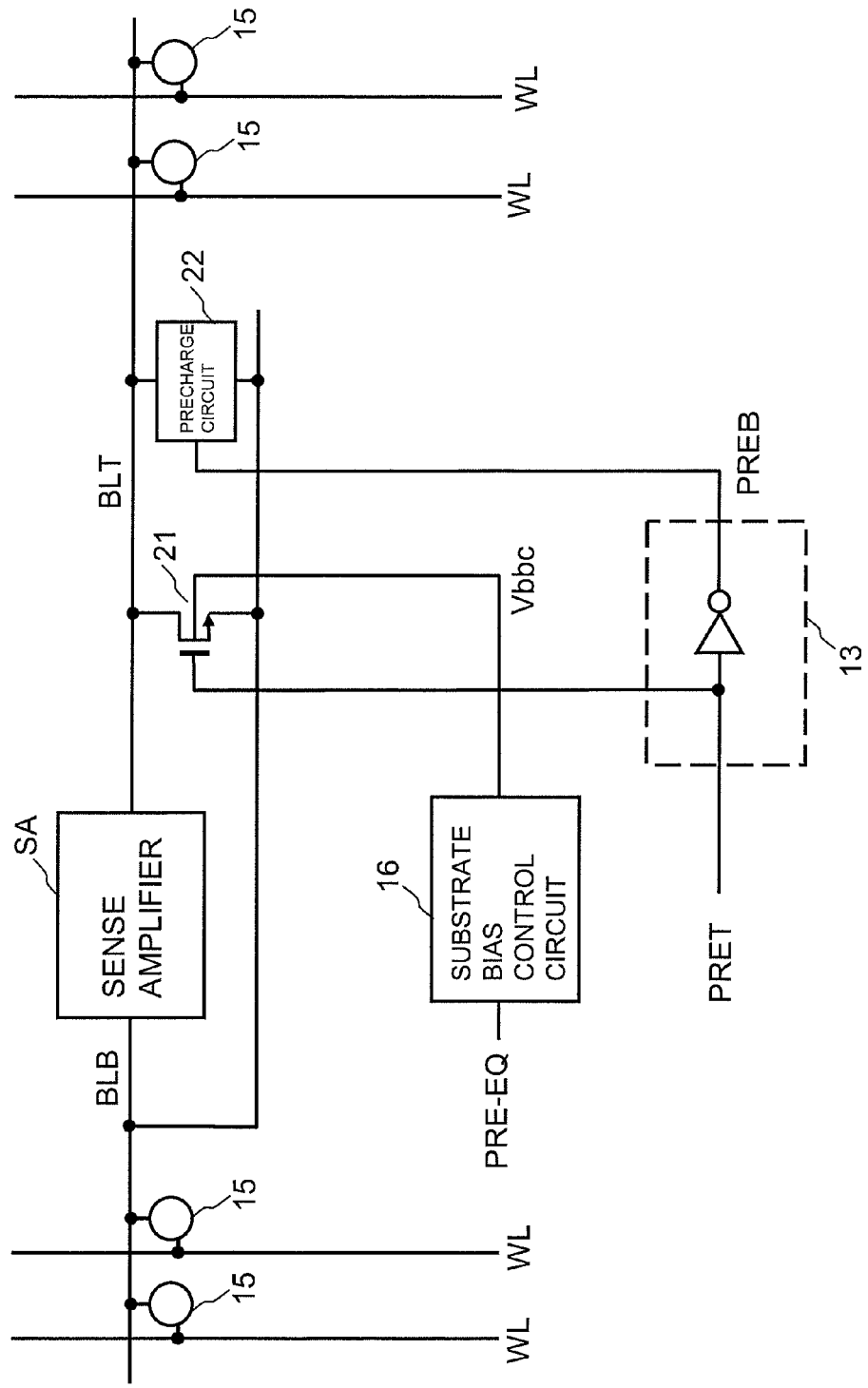
FIG. 2 is a block diagram in the vicinity of a sense amplifier of the semiconductor memory device in the example.

FIG. 2 is a more detailed block diagram of the bank region 10 in the vicinity of the sense amplifier SA. A bit line equalize transistor 21 and a bit line precharge circuit 22 are disposed in the vicinity of the sense amplifier SA. Two bit lines BLT and BLB, which forms a pair, are connected to the sense amplifier SA. The bit lines BLT and BLB, which forms the pair, are respectively connected to a plurality of the memory cells 15.

The bit line equalize transistor 21 is an N-type MOS transistor (NMOS transistor), and is connected between the bit lines BLT and BLB, which forms the pair. One of a source and a drain of the bit line equalize transistor 21 is connected to the bit line BLT, while the other of the source and the drain of the bit line equalize transistor 21 is connected to the bit line BLB. The precharge signal PRET is supplied to a gate (control terminal) of the transistor 21 from the equalize control circuit 13, as an equalize signal. Further, the substrate bias voltage Vbbc output from the substrate bias control circuit 16 is supplied to a back gate of the equalize transistor 21. This bit line equalize transistor 21 turns on when the precharge signal PRET assumes a high level that indicates an active state, and equalizes potentials of the pair of the bit lines (BLT, BLB). The precharge circuit 22 is a circuit that supplies a predetermined precharge potential to each of the pair of the bit lines (BLT, BLB). An inverted precharge signal PREB is supplied to the precharge circuit 22 from the equalize control circuit 13. The equalize control circuit 13 generates the inverted precharge signal PREB from the precharge signal PRET. The sense amplifier SA is a circuit that amplifies a potential difference between the pair of the bit lines (BLT, BLB).

Figure 3:
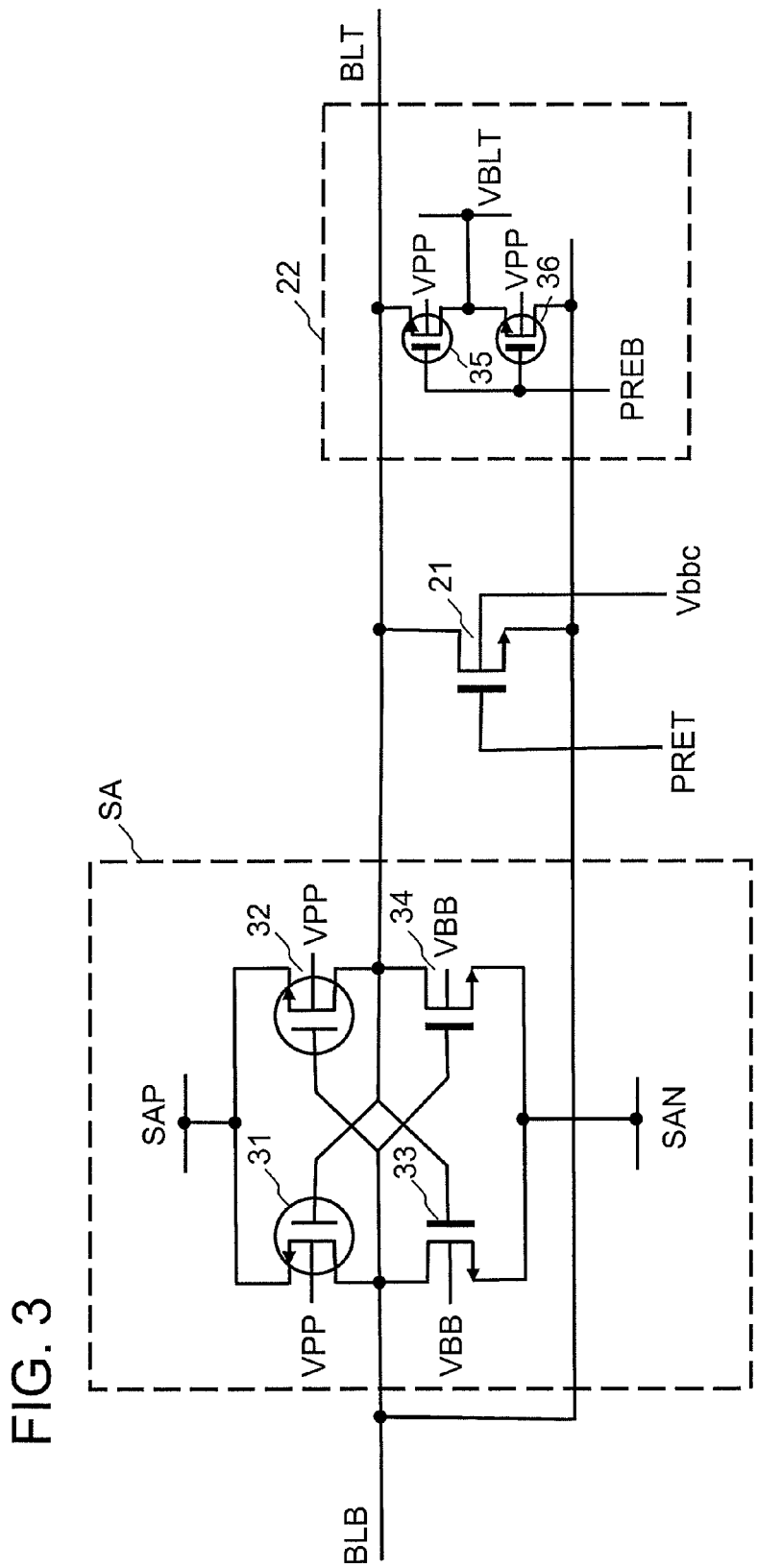
FIG. 3 is a circuit diagram in the vicinity of the sense amplifier in the example.

FIG. 3 is a more detailed circuit diagram of a portion in the vicinity of the sense amplifier SA showing even configurations of internal circuits of the sense amplifier SA and the precharge circuit 22. The sense amplifier SA, bit line equalize transistor 21, and precharge circuit 22 shown in FIG. 3 may be disposed in the sense amplifier column 14 in FIG. 1. The sense amplifier SA includes two CMOS inverters that are cross connected between a high-potential power supply SAP and a low-potential power supply SAN given at a time of a sense amplifier operation. An input terminal of a first CMOS inverter including a PMOS transistor 31 and an NMOS transistor 33 is connected to the bit line BLT, and an output terminal of the first CMOS inverter is connected to the bit line BLB. An input terminal of a second CMOS inverter including a PMOS transistor 32 and an NMOS transistor 34 is connected to the bit line BLB, and an output terminal of the second CMOS inverter is connected to the bit line BLT. When the power supplies SAP and SAN are supplied to the sense amplifier SA and a potential difference is generated between the pair of the bit lines BLT and BLB after the pair of the bit lines BLT and BLB have been equalized by the transistor 21, the potential difference is amplified by these two inverters.

A potential VPP is supplied to each of the PMOS transistors 31 and 32 that constitute this sense amplifier SA as a substrate potential, while a potential VBB is supplied to each of the NMOS transistors 33 and 34 as a substrate potential. The PMOS transistors 31 and 32 and the NMOS transistors 33 and 34 constitute this sense amplifier SA. These NMOS transistors 33 and 34 and the equalize transistor 21 are all connected to the common pair of the bit lines (BLT, BLB), and the equalize transistor 21 is disposed in the vicinity of the sense amplifier SA. It is necessary to supply to the equalize transistor 21 a substrate bias voltage that is different from a substrate bias voltage for the NMOS transistors 33 and 34 of the sense amplifier SA. Thus, a P well for forming the NMOS transistors 33 and 34 that constitute the sense amplifier SA and a P well for forming the equalize transistor 21 are separately provided. Each of the P well for forming the NMOS transistors 33 and 34 and the equalize transistor 21 is formed so that the substrate bias voltage may be independently applied to the P well.

The precharge circuit 22 includes PMOS transistors 35 and 36. One end of a source and a drain of the PMOS transistor 35 is connected to the bit line BLT, while the other end of the source and the drain of the PMOS transistor 35 is connected to a precharging power supply VBLT. One end of a source and a drain of the PMOS transistor 36 is connected to the bit line BLB, and the other end of the source and the drain of the PMOS transistor 36 is connected to the precharging power supply VBLT. A potential VPP is supplied to a back gate of each of the PMOS transistors 35 and 36 as a substrate potential, as in the case of the PMOS transistors 31 and 32 that form the sense amplifier.

Figure 4:
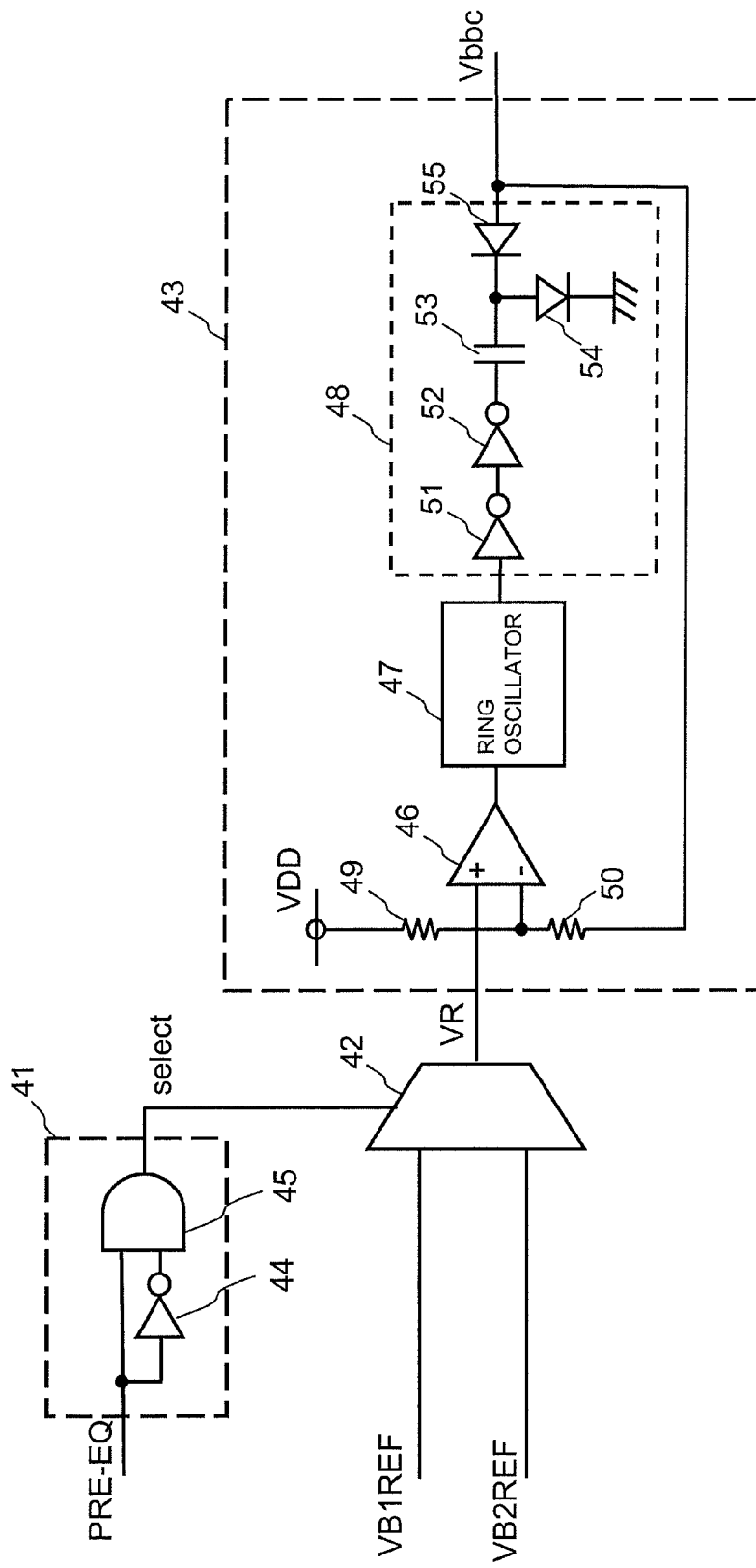
FIG. 4 is a block diagram of a substrate bias control circuit in the example.

FIG. 4 is a block diagram of the substrate bias control circuit 16. The substrate bias control circuit 16 that generates the substrate voltage for the equalize transistor 21 includes a switching control unit 41, a reference voltage switching unit 42, and a back bias generation unit 43.

The switching control unit 41 receives the equalizing precharge signal PRE-EQ, and outputs a substrate bias selection signal select that is a signal which controls an operation of whether a first substrate bias voltage VB1 or a second substrate bias voltage VB2 is supplied to the bit line equalize transistor 21. As shown in FIG. 4, for example, the switching control unit 41 may be constituted from a delay circuit (inverter) 44 which receives the equalizing precharge signal PRE-EQ and outputs an inverted signal that is delayed with respect to the input signal and an AND circuit 45 that receives the equalizing precharge signal PRE-EQ and the equalizing precharge signal PRE-EQ which has been delayed and inverted by the inverter 44. According to the configuration of the switching control unit 41 in FIG. 4, after the equalizing precharge signal PRE-EQ has risen from low to high, the switching control unit 41 outputs the substrate bias selection signal select at a high level for a certain period. Otherwise, the switching control unit 41 outputs the substrate bias selection signal select at a low level. The certain period in which the substrate bias selection signal select outputs the high level is determined by a transmission delay time of the inverter 44.

The reference voltage switching unit 42 receives a first reference voltage signal VB1REF that provides a reference for the first substrate bias voltage VB1 and a second reference voltage signal VB2REF that provides a reference for the second substrate bias voltage VB2. The reference voltage switching unit 42 selects the first reference voltage signal VB1REF or the second reference voltage signal VB2REF, based on the substrate bias selection signal select, and outputs the selected reference voltage signal as a control voltage signal VR. The potential of the first reference voltage signal VB1REF is lower than the potential of the second reference voltage signal VB2REF.

The back bias generation unit 43 is a circuit that generates the substrate bias voltage Vbbc to be supplied to the bit line equalize transistor 21, based on the control voltage signal VR. The back bias generation unit 43 includes a voltage comparison circuit 46 that compares a voltage of the control voltage signal VR with the substrate bias voltage Vbbc, a ring oscillator 47 of which operation is controlled by a result of comparison by the voltage comparison circuit 46, and a charge pump circuit 48 that generates the substrate bias voltage Vbbc based on a clock generated by the ring oscillator 47.

The voltage comparison circuit 46 receives the control voltage signal VR output by the reference voltage switching unit 42 and a voltage obtained by resistive division by resistors 49 and 50 connected in series between a high-potential supply voltage VDD and the substrate bias voltage Vbbc. When the voltage of the control voltage signal VR is high, the voltage comparison circuit 46 performs control so that oscillation of the ring oscillator 47 is stopped. When the voltage of the control voltage signal VR is low, the voltage comparison circuit 46 performs control so that the ring oscillator 47 oscillates.

The charge pump circuit 48 is constituted from waveform shaping inverters 51 and 52, a capacitor 53, and diodes 54 and 55. The charge pump circuit 48 in FIG. 4 is the charge pump circuit 48 that generates a negative voltage according to orientations of the diodes 54 and 55. The back bias generation unit 43 as a whole controls a voltage value of the substrate bias voltage Vbbc so that the voltage obtained by resistive division by the resistors 49 and 50 between the substrate bias voltage Vbbc and the high-potential power supply VDD has the same potential as the control voltage signal VR.

Figure 5:
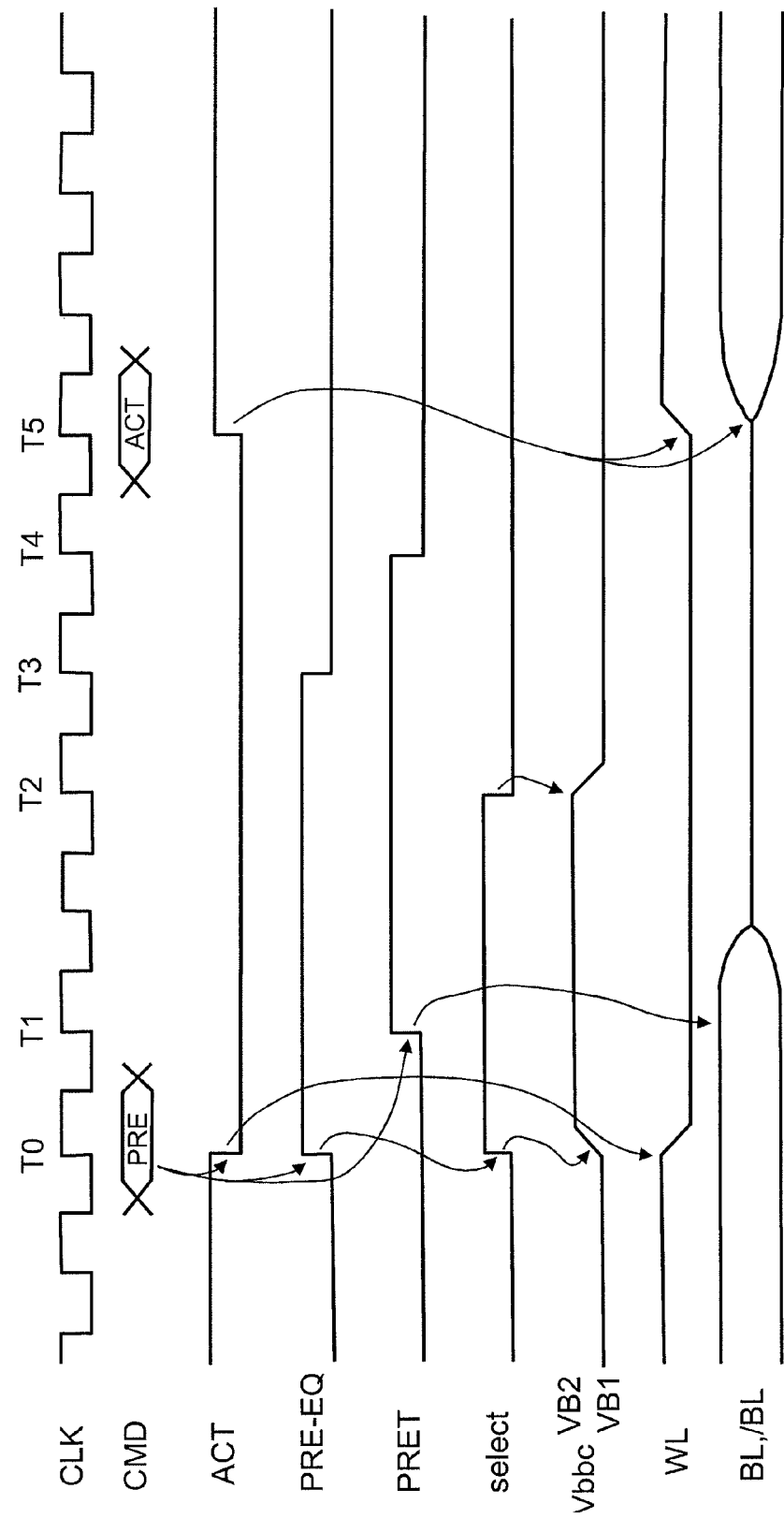
FIG. 5 is a waveform diagram of the semiconductor device in the example.

Next, an operation of the semiconductor memory device 1 in the first example will be described, using a waveform diagram in FIG. 5. It is assumed that the semiconductor memory device 1 is in an activated state (active state) before a time T0. At the time T0, the command decode circuit 17 captures the precharge command (PRE) supplied from the outside, in synchronization with the clock signal received from the clock signal input terminal CLK. According to capture of the precharge command by the command decode circuit 17, the act signal ACT transitions from a high level which is an active level to a low level which is an inactive level. The equalizing precharge signal PRE-EQ transitions from a low level which is an inactive level to a high level which is an active level.

In response to the inactive level of the act signal ACT, the potential of a predetermined word line (WL) which has been at a high level of a selection state transitions to a low level of a nonselection state. Further, in response to the active level of the equalizing precharge signal PRE-EQ, the switching control unit 41 of the substrate bias control circuit 16 causes the selection signal select to transition from the low level to the high level.

In response to the high level of the selection signal select, the reference voltage switching unit 42 of the substrate bias control circuit 16 switches the control voltage signal VR to be supplied to the back bias generation unit 43 from a voltage VB1REF to a voltage VB2REF that has a higher potential. In response to switching of the control voltage signal VR to the voltage VB2REF, the back bias generation unit 43 of the substrate bias control circuit 16 switches the substrate bias voltage Vbbc of the bit line equalize transistor 21 to the shallower (higher-voltage) substrate bias voltage VB2 from the deep (lower-voltage) substrate bias voltage VB1.

The precharge signal PRET transitions from a low level of an inactive level to a high level of an active level after a predetermined time of delay (at a time T1 in FIG. 5) through the delay circuit Delay after capture of the precharge command by the command decode circuit 17. When the precharge signal PRET assumes the active level, the bit line equalize transistor 21 turns on. Bit line equalization is thereby started.

At a time T2, an output of the inverter circuit 44 provided at the substrate bias control circuit 16 for signal delay is inverted to a low level, and an output signal of the AND circuit 45 is inverted due to that inversion. Then, the selection signal select transitions from the high level to the low level. In response to transition of the selection signal select to the low level, the potential of the control voltage signal VR switches from the voltage VB2REF to the voltage VB1REF, and the substrate bias voltage Vbbc generated by the back bias generation unit 43 also switches from the shallow substrate bias VB2 to the deeper substrate bias voltage VB1.

The timing (timing at the time T2) at which the selection signal select transitions to the low level again after activation of the equalizing precharge signal PRE-EQ may be at least after bit line pair equalization has been completed. Preferably, this switch timing (timing at which the substrate bias voltage of the bit line equalize transistor 21 is returned to the deeper voltage, or the timing of the time T2) is set after completion of the bit line equalization and before a timing at which an amplification operation (which will be described later) of a potential difference of a bit line pair by the sense amplifier is completed. This setting is made for the following reason. When the selection signal select transitions to the low level from the high level before completion of the bit line pair equalization and then the substrate bias of the bit line equalize transistor 21 is reduced (becomes deeper) during the bit line equalization, current driving capability of the bit line equalize transistor 21 is reduced. As a result, a bit line equalization time after reduction of the current driving capability is increased. Further, after the amplification operation by the sense amplifier has been completed, a potential difference between the bit line pair, or a source-to-drain voltage of the bit line equalize transistor 21 is increased. Off current that flows through the bit line equalize transistor is therefore increased. Current consumption of the semiconductor memory device 1 is thus increased. Thus, the setting described above is made.

At a time T3, the command decode circuit 17 causes the equalizing precharge signal PRE-EQ to transition from the high level of the active level to the low level of the inactive level. After an elapse of a predetermined delay time from transition from the active level to the inactive level of the equalizing precharge signal PRE-EQ, the precharge signal (PRET) transitions from the high level of the active level to the low level of the inactive level (at a time T4 in FIG. 5).

In response to transition of the precharge signal PRET to an inactive state, the bit line equalize transistor 21 turns off, and the semiconductor memory device 1 assumes a stand-by state (idle state).

At a time T5, the command decode circuit 17 captures the active command (ACT) supplied from the outside, in synchronization with the clock (CLK). In response to capture of the active command by the command decode circuit 17, the act signal ACT transitions from the low level of the inactive level to the high level of the active level.

In response to the high level of the active level of the act signal ACT, the semiconductor memory device 1 assumes the active state. Specifically, the potential of the word line (WL) corresponding to the row address supplied from the outside transitions from the low level of the nonselection state to the high level of the selection state. Then, data (electric charge) held in the memory cell connected to the word line that has assumed the selection state is read onto the pair of the bit lines (BLT/BLB), and a potential difference between the pair of the bit lines is amplified by the sense amplifier. Then, a read command or a write command is supplied from the outside. The semiconductor memory device 1 thereby performs a desired operation (not shown). When the precharge command (PRE) is supplied again from the outside after the desired operation has been finished, time is returned to the time T0 shown in FIG. 5. The operations are thereby repeated.

Second Example

Figure 6:
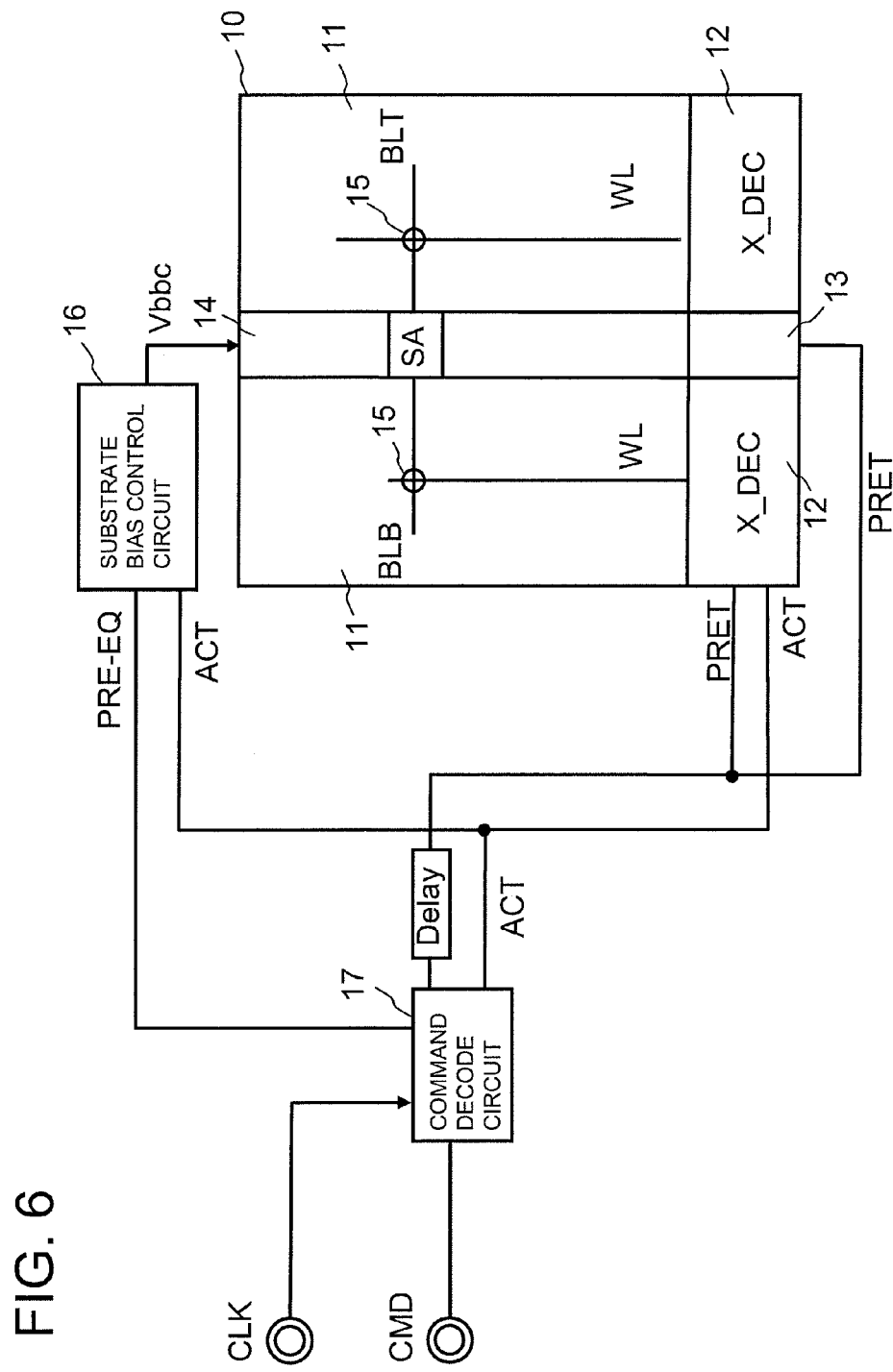
FIG. 6 is a block diagram of a semiconductor memory device in another example of the present invention.

FIG. 6 is a block diagram of a semiconductor memory device according to a second example. Same reference characters are assigned to components that are comparable to those in the first example, thereby omitting detailed description. In the second example, in addition to the equalizing precharge signal PRE-EQ, the act signal ACT is also supplied to the substrate bias control circuit 16 from the command decode circuit 17. The second example is different from the first example in this respect. The other configurations are the same as those in the first example.

Figure 7:
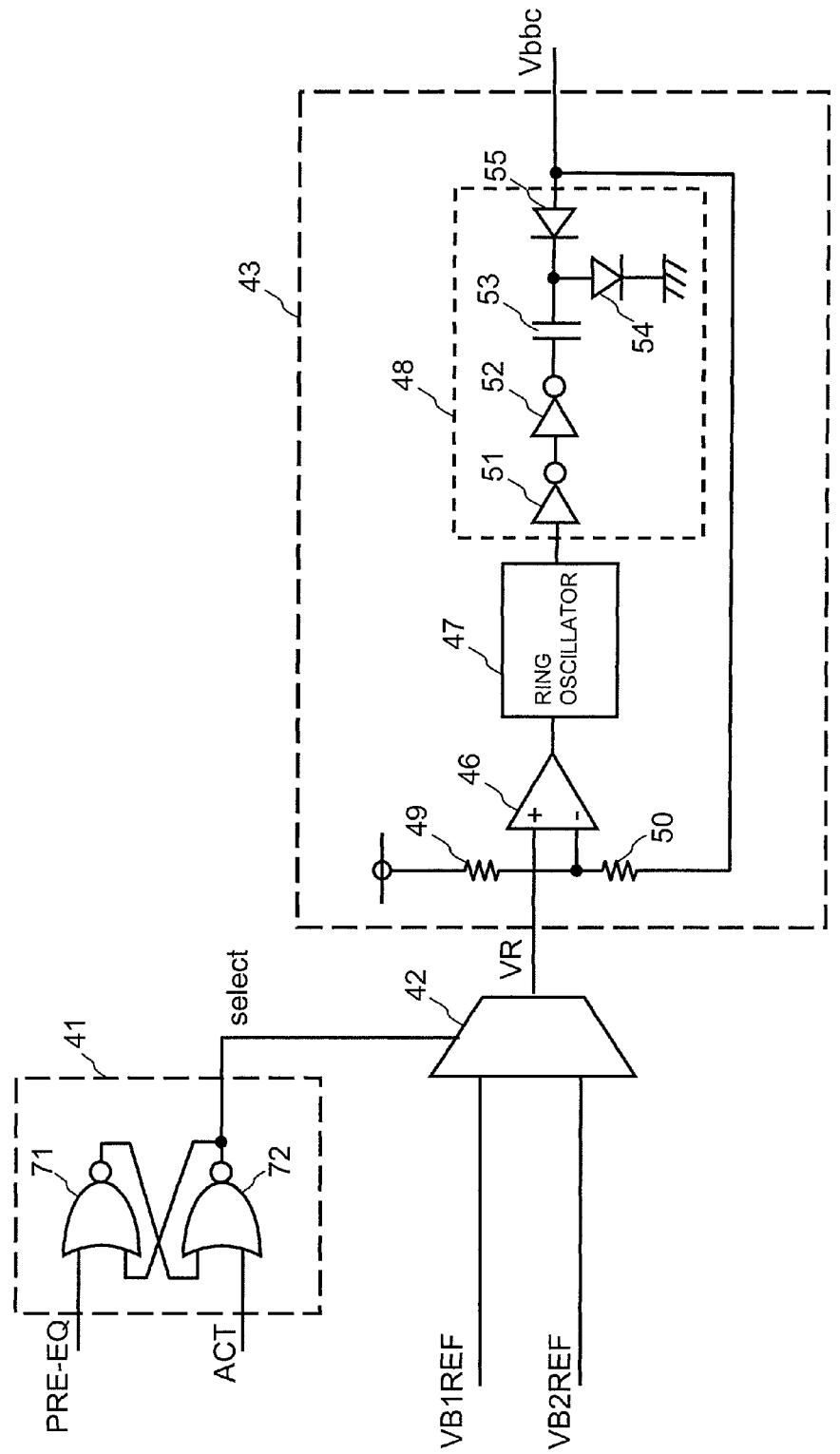
FIG. 7 is a block diagram of a substrate bias control circuit in the another example.

FIG. 7 is a block diagram of the substrate bias control circuit 16 in the second example. The substrate bias control circuit 16 in the second example is different from the substrate bias control circuit (in FIG. 4) in the first example in the configuration of the switching control unit 41. Configurations of the reference voltage switching unit 42 and the back bias generation unit 43 except the switching control unit 41 are the same as those in the first example.

In addition to the equalizing precharge signal PRE-EQ, the act signal ACT is connected to the switching control unit 41 in the second example, as an input signal. When the equalizing precharge signal PRE-EQ transitions from the low level to the high level in the second example, the switching control unit 41 outputs a high level to a selection signal select, and switches the substrate bias voltage Vbbc to the shallow substrate bias voltage VB2. A condition in which this substrate bias voltage Vbbc is switched to the shallow substrate bias voltage VB2 continues also after the equalizing precharge signal PRE-EQ has returned to the low level, and continues until the act signal ACT goes high. When the act signal ACT goes high from low, the selection signal select goes low from high, thereby switching the substrate bias voltage Vbbc to the deep substrate bias voltage VB1.

As described in FIG. 7 in the form of an example, the switching control unit 41 that implements such a function may be implemented by providing a flip-flop circuit (constituted from NOR circuits 71 and 72) that is set by the equalizing precharge signal PRE-EQ and is reset by the act signal ACT, and by setting an output of the flip-flop circuit as the selection signal select in the circuit configuration of the switching control unit 41.

Figure 8:
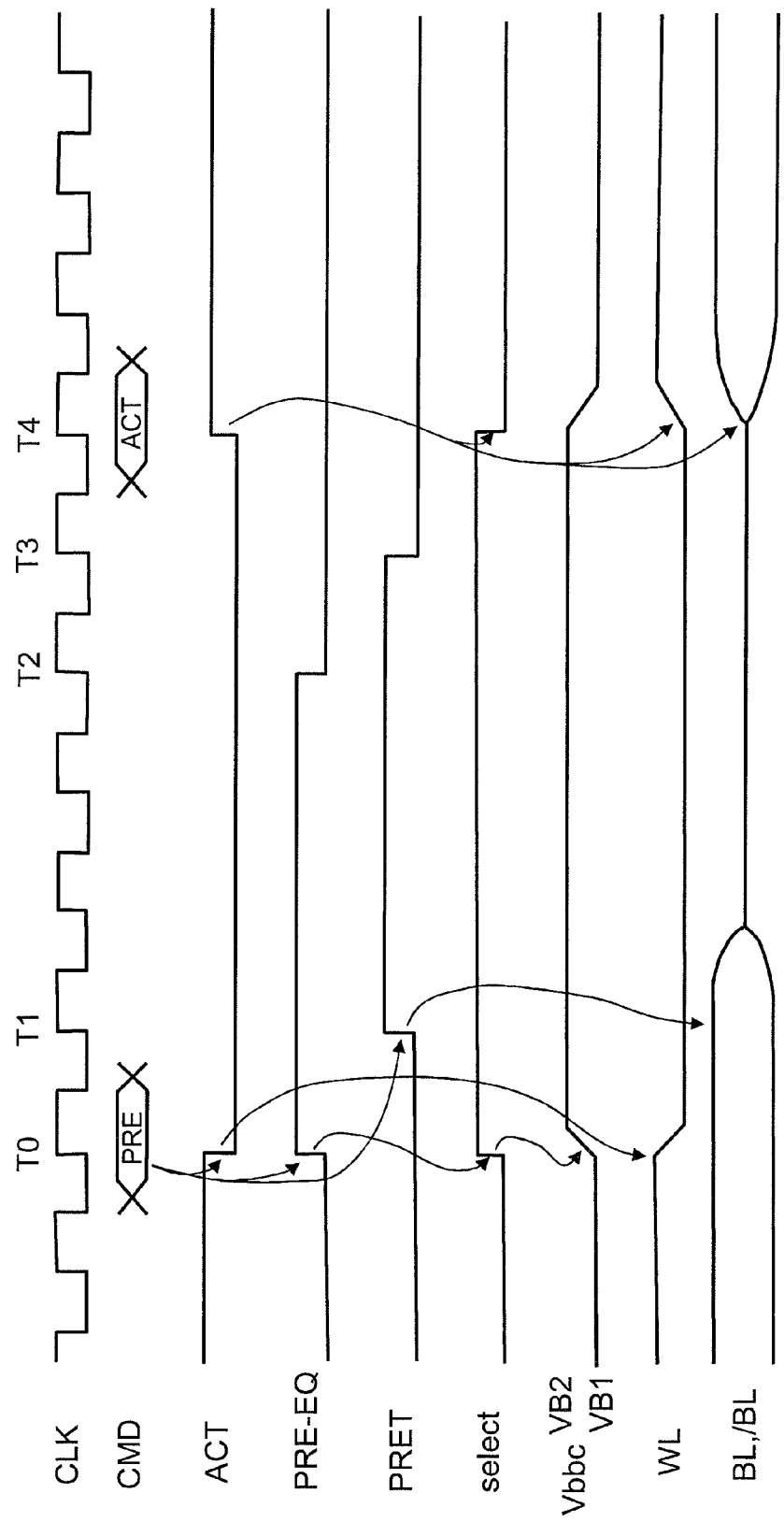
FIG. 8 is a waveform diagram of the semiconductor device in the another example.

FIG. 8 is a waveform diagram of the semiconductor device 1 in the second example. Referring to FIG. 8, description of components of which operations are the same as those in FIG. 5 that is the waveform diagram of the first example, will be omitted, and components of which operations are different from those in FIG. 5 will be described.

Referring to FIG. 8, upon receipt of the precharge command (PRE), the equalizing precharge signal PRE-EQ rises, the selection signal select rises, and the substrate bias voltage Vbbc of the bit line equalize transistor 21 changes from the voltage VB1 to the voltage VB2. These operations are the same as those in the first example. The word line WL assumes the nonselection state in response to a fall of the act signal ACT, and bit line equalization is started when the delayed precharge signal PRET rises. These operations are also the same as those in the first example.

The first example is different from the second example in a timing at which the selection signal select falls, and the substrate bias voltage Vbbc of the bit line equalize transistor 21 changes from the voltage VB2 to the voltage VB1. In the second example, the condition in which the substrate bias voltage Vbbc is the shallow substrate bias voltage VB2 continues until the active command (ACT) is supplied to the command decode circuit 17. When the active command (ACT) is supplied from an outside at a time T4 in synchronization with the clock signal CLK, the command decode circuit 17 activates the act signal ACT. When the act signal ACT is activated to go high, the switching control unit 41 of the substrate bias control circuit 16 causes the selection signal select to fall from high to low. Thus, the substrate bias voltage Vbbc output from the substrate bias control circuit 16 changes to the deep first substrate bias voltage VB1 from the shallow second substrate bias voltage VB2. The word line WL selected upon receipt of the active command is activated, data from a selected memory cell is read onto the bit line due to activation of the word line WL, and the potential of the bit line is amplified by the sense amplifier SA. These operations are the same as those in the first example.

In the first example, after the precharge command has been received and the substrate bias voltage Vbbc of the bit line equalize transistor 21 has become the shallow second substrate bias voltage VB2, the substrate bias voltage Vbbc automatically returns to the deep first substrate bias voltage VB1 after a certain period of time. On contrast therewith, in the second example, after the substrate bias voltage Vbbc of the bit line equalize transistor 21 has become the shallow second substrate bias voltage VB2 due to reception of the precharge command, the condition where the substrate bias voltage Vbbc is the shallow voltage continues until the active command has been received. With execution of the active command, the substrate bias voltage Vbbc returns to the deep first substrate voltage VB1. These operations are different from those in the first example.

The threshold value of the transistor 21 at a time of equalization may be a low threshold value corresponding to a depletion transistor, in the first and second examples. It is because, before cell data is read onto a bit line due to activation of a word line, it is possible to return the substrate bias voltage to the deep voltage and return the threshold value of the bit line equalize transistor 21 to a high voltage. When equalization is not performed, Ioff current can be reduced by deepening the substrate bias voltage more than in a related art.

In the first and second examples, the bit line equalize transistor 21 was described as the N-type MOS transistor. A P-type MOS transistor, however, may also be used as the bit line equalize transistor 21. In this case as well, the substrate bias control circuit 16 may control the substrate bias voltage Vbbc so that the threshold voltage of the bit line equalize transistor is reduced according to activation of the equalizing precharge signal PRE-EQ and the threshold voltage of the bit line equalize transistor is increased according to transition of the select signal select from the high level to the low level or reception of the active command. That is, when the P-type MOS transistor is used as the bit line equalize transistor 21, the substrate bias control circuit 16 may perform control so that the substrate bias voltage Vbbc is reduced according to activation of the equalizing precharge signal PRE-EQ and the substrate bias voltage Vbbc is increased according to transition of the select signal select from the high level to the low level or reception of the active command.

Description was given about each of the examples where bit lines of the semiconductor memory device are equalized. The present invention may be applied to equalization before amplification of a difference voltage between two sense lines by the sense amplifier, in addition to bit line equalization. By controlling the substrate bias voltage of the equalize transistor, high-speed equalization can be performed, and leak current between the sense lines can be prevented at a timing in a period other than a period of the equalization.

The above description was given about the examples. The present invention is not limited to only configurations of the examples described above, and of course includes various variations and modifications that could be made by those skilled in the art within the range of the present invention.

What is claimed is:

1. A device comprising:
   first and second bit lines;
   a first transistor of a first channel type coupled between the first and second bit lines and receiving a first substrate bias voltage, which is a variable voltage, at a back gate thereof; and
   a first sense amplifier coupled to the first and second bit lines and configured to amplify a voltage difference between the first and second bit lines, the sense amplifier including a second transistor of the first channel type, the second transistor receiving a second substrate bias voltage at a back gate thereof, the second substrate bias voltage being different in voltage level from the first substrate bias voltage.

2. The device as claimed in claim 1, wherein the first substrate bias voltage changes between first and second voltage levels and the second substrate bias voltage takes a third voltage level being substantially constant.

3. The device as claimed in claim 2, wherein the third voltage level is different from both of the first and second voltage levels.

4. The device as claimed in claim 2, wherein the third voltage level is substantially equal to one of the first and second voltage levels.

5. The device as claimed in claim 1, wherein the first channel type is an N-channel type.

6. The device as claimed in claim 1, wherein the first channel type is a P-channel type.

7. The device as claimed in claim 1, wherein the first transistor includes a first electrode directly coupled to the first bit line and a second electrode directly coupled to the second bit line, and the second transistor includes a third electrode directly coupled to one of the first and second bit lines.

8. The device as claimed in claim 1, wherein the first and second bit lines are complementally to each other.

9. The device as claimed in claim 1, further comprising a plurality of first memory cells coupled to the first bit line, and a plurality of second memory cells coupled to the second bit line.

10. The device as claimed in claim 1, further comprising:
a plurality of third bit lines,
a plurality of fourth bit lines,
a plurality of second equalizing transistors each including a source-drain path coupled between a corresponding one of the third bit lines and a corresponding one of the fourth bit lines, the second equalizing transistors being disposed in the first well region of the semiconductor substrate, and
a plurality of second sense amplifiers each coupled to a corresponding one of the third bit lines and a corresponding one of the fourth bit lines and configured to amplify a voltage difference between the corresponding one of the third bit lines and the corresponding one of the fourth bit lines, each of the second sense amplifier including a fourth transistor of the first channel type, the fourth transistor of each of the second amplifiers receiving the second substrate bias voltage at a back gate thereof, and
wherein each of the first, second, third and fourth bit lines is elongated in a first direction, the first and third transistors are arranged in a second direction crossing the first direction, and the first and second sense amplifiers are arranged in the second direction.

11. The device as claimed in claim 1, wherein the first substrate bias voltage changes between first and second voltage levels based on a precharge equalizing signal.

12. A device comprising:
a semiconductor substrate including first and second well regions that are equal in conductivity type to each other and are provided separately from each other;
first and second bit lines;
a first equalizing transistor including a source-drain path coupled between the first and second bit lines, the first equalizing transistor being disposed in the first well region of the semiconductor substrate; and
a first sense amplifier amplifying a voltage difference between the first and second bit lines and including first and second sense transistors each being equal in channel type to the first equalizing transistor, each of the first and second sense transistors being disposed in the second well region of the semiconductor substrate, the first sense transistor including a source-drain path coupled between the first bit line and a reference voltage line, and the second sense transistor including a source-drain path coupled between the second bit line and the reference voltage line;
wherein the first well region receives a first substrate bias voltage that changes between first and second voltage levels and the second well region receives a second substrate bias voltage that takes a third voltage different from at least one of the first and second voltage levels.

13. The device as claimed in claim 12, wherein the third voltage is substantially constant.

14. The device as claimed in claim 12, wherein conductivity types of the first and second well regions are P-types and channel types of the equalizing and the sense transistors are N-channel types.

15. The device as claimed in claim 12, wherein, conductivity types of the first and second well regions are N-types and channel types of the equalizing and the sense transistors are P-channel types.

16. The device as claimed in claim 12, wherein the first equalizing transistor includes a first electrode directly coupled to the first bit line and a second electrode directly coupled to the second bit line, the first sense transistor includes a third electrode directly coupled to the first bit line, and the second sense transistor includes a fourth electrode directly coupled to the second bit line.

17. The device as claimed in claim 12, wherein the first and second bit lines are complementally to each other.

18. The device as claimed in claim 7, further comprising a plurality of first memory cells coupled to the first bit line, and a plurality of second memory cells coupled to the second bit line.

19. The device as claimed in claim 12, further comprising:
a plurality of third bit lines,
a plurality of fourth bit lines,
a plurality of third transistors of the first channel type, each of the third transistors being coupled between a corresponding one of the third bit lines and a corresponding one of the fourth bit lines and receiving the first substrate bias voltage at a back gate thereof, and
a plurality of second sense amplifiers each amplifying a voltage difference between a corresponding one of the third bit lines and a corresponding one of the fourth bit lines and including third and fourth sense transistors, each of the third and fourth sense transistors of each of the second sense amplifiers being equal in channel type to a corresponding one of the second equalizing transistors and being disposed in the second well region of the semiconductor substrate, the third sense transistor of each of the second sense amplifiers including a source-drain path coupled between the corresponding one of the third bit line and the reference voltage line, and the fourth sense transistor of each of the second sense amplifiers including a source-drain path coupled between the corresponding one of the fourth bit lines and the reference voltage line, and
wherein each of the first, second, third and fourth bit lines is elongated in a first direction, the first and second equalizing transistors are arranged in a second direction crossing the first direction, and the first and second sense amplifiers are arranged in the second direction.

* * * * *